US007349293B2

United States Patent
Suzuki et al.

(10) Patent No.: US 7,349,293 B2
(45) Date of Patent: Mar. 25, 2008

(54) PRESSURE CONTROL APPARATUS AND ROTATION DRIVE MECHANISM

(75) Inventors: Toshihiro Suzuki, Tokyo (JP); Teruo Mori, Tokyo (JP)

(73) Assignee: TDK Corporation, Tokyo (JP)

( * ) Notice: Subject to any disclaimer, the term of this patent is extended or adjusted under 35 U.S.C. 154(b) by 329 days.

(21) Appl. No.: 10/557,195

(22) PCT Filed: May 18, 2004

(86) PCT No.: PCT/JP2004/007065

§ 371 (c)(1),
(2), (4) Date: Nov. 17, 2005

(87) PCT Pub. No.: WO2004/102782

PCT Pub. Date: Nov. 25, 2004

(65) Prior Publication Data

US 2007/0133353 A1    Jun. 14, 2007

(30) Foreign Application Priority Data

May 19, 2003    (JP)    ............................. 2003-140696

(51) Int. Cl.
*H02N 2/04*    (2006.01)
(52) U.S. Cl. ...................................... 367/140; 367/165
(58) Field of Classification Search ............... 367/140, 367/165
See application file for complete search history.

(56) References Cited

U.S. PATENT DOCUMENTS 6,565,333 B2*    5/2003    Maruyama ................... 419/469
7,131,555 B2*    11/2006    Maruyama et al. .......... 417/417
2002/0025260 A1*    2/2002    Maruyama ................... 417/469
2007/0133353 A1*    6/2007    Suzuki et al. ................ 367/165

FOREIGN PATENT DOCUMENTS

JP    7-236292    9/1995
JP    11-159537    6/1999

OTHER PUBLICATIONS

English language abstract of JP 7-236292.
English language abstract of JP 11-159537.

* cited by examiner

*Primary Examiner*—Dan Pihulic
(74) *Attorney, Agent, or Firm*—Greenblum & Bernstein, P.L.C.

(57) ABSTRACT

A pressure control apparatus according to the present invention is comprised of a magnetostrictive element section disposed between respective one ends of rotating rods which have the one ends thereof arranged on the same axis in a state connected to each other such that they are unrotatable relative to each other but at the same time are movable toward and away from each other, the rotating rods being rotatable about the axis in unison with each other, an urging means for urging the rotating rods to cause them to be closer to each other to thereby bring the respective one ends of the rotating rods into intimate contact with ends of the magnetostrictive element section, respectively, a magnetic field-applying means for generating a magnetic field for use in adjusting the length of the magnetostrictive element section to apply the magnetic field to the magnetostrictive element section, a pressure-detecting means for detecting pressure generated in the rotating rods in the direction of the axis, and a control section for controlling detected pressure such that it is constant, by controlling a strength of the magnetic field to adjust the length of the magnetostrictive element section.

12 Claims, 4 Drawing Sheets

F I G. 6
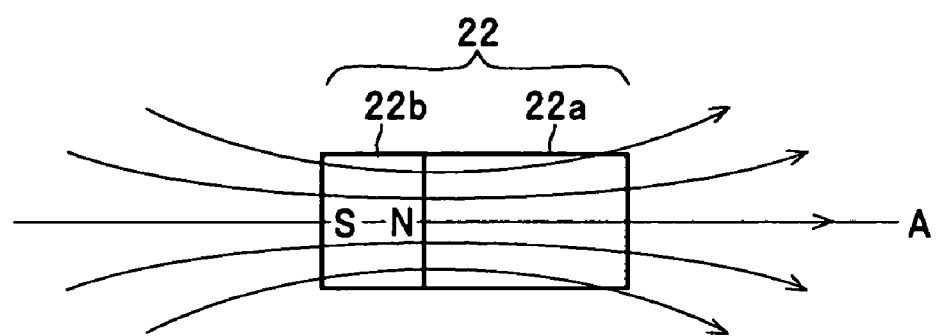

PRESSURE CONTROL APPARATUS AND ROTATION DRIVE MECHANISM

TECHNICAL FIELD

The present invention relates to a pressure control apparatus capable of controlling axial pressure generated in rotating rods arranged on the same axis, and a rotation drive mechanism including the pressure control apparatus.

BACKGROUND ART

In recent years, a magnetostrictive element has come to be widely used e.g., in small-stroke reciprocating actuators that actuate an opening/closing valve for a hydraulic circuit or a pneumatic circuit. In this case, the magnetostrictive element is worked into a magnetostrictive rod, and is responsive to a magnetic field applied from an electromagnetic coil for having its longitudinal dimension adjusted to thereby actuate a valve element of the opening/closing valve formed to extend in the direction of expansion of the magnetostrictive element as an object to be actuated by the same, thereby opening and closing the opening/closing valve. However, the magnetostrictive rod suffers from the problem that it varies in longitudinal dimension with a change in temperature due to its characteristic, and therefore the amount of actuation of the valve element varies due to a change in temperature. To solve this problem, there has been proposed an ultra-magnetostrictive actuation assembly in Japanese Laid-Open Patent Publication (Kokai) No. H07-236292, which comprises as shown in FIGS. 1 and 2 of the publication, a temperature-detecting means (8) for detecting a temperature in the vicinity of a ultra-magnetostrictive rod (5), and a magnetic field control means (9) for controlling a magnetic field generated by a solenoid coil (4) based on the temperature detected by the temperature-detecting means (8), and operates to provide control such that the length of the ultra-magnetostrictive rod (5) is constant even when a change in temperature occurs, to thereby control the amount of actuation of an object to be actuated such that it is constant.

DISCLOSURE OF THE INVENTION

By the way, a rod (hereinafter referred to as "the rotating rod") for transmitting torque from a drive source, such as a motor or a prime mover, to a work (to-be-driven object), also undergoes a change in length depending on a change in temperature. Further, such a rotating rod is relatively often used in a state where movements of opposite ends thereof are restricted by the drive source and the work, e.g., such that one end thereof is connected to a transmission, and the other end thereof to a differential gear, as in the case of a propeller shaft for a vehicle. In this state of use, when the rotating rod is expanded, there occur problems that the drive source and the work are adversely affected by axial pressure (compression force) generated in the rotating rod, and the rotating rod itself is bent by the pressure and broken due to rotation thereof in the bent state.

To cope with these problems, it is envisaged that the technique proposed in the above-described Japanese Laid-Open Patent Publication (Kokai) No. H07-236292 is applied to the above rod. That is, it is envisaged that the rotating rod is formed of a magnetostrictive material to cause the whole length thereof to be controlled to be constant, to thereby avoid occurrence of the above problems.

However, from the study of the configuration in which the rotating rod is formed of a magnetostrictive material to thereby cause the whole length thereof to be controlled to be constant, the present inventors found out the following problems to be solved: The magnetostrictive material has characteristics that although it has sufficient durability against pressure (a compression force, and an expansion force) axially applied thereto, it is fragile against a twisting force. Therefore, it is difficult to apply the technique disclosed in the Japanese Laid-Open Patent Publication (Kokai) No. H07-236292 to the rotating rod to which is added a twisting force during transmission of the torque from the drive source to the work.

The present invention has been made in view of these problems, and a main object thereof is to provide a pressure control apparatus which is capable of controlling axial pressure generated in a rotating rod due to a change in temperature such that the pressure is constant, while sufficiently ensuring a torque-transmitting function of the rotating rod which is used in a state in which movements of opposite ends thereof are restricted. Another main object thereof is to provide a rotation drive mechanism including the pressure control apparatus, which is capable of reliably transmitting torque from a drive source to a work, and further positively avoiding damage to the drive source, the work, and the rotating rod by controlling the axial pressure generated in the rotating rod due to a change in temperature, such that the pressure is constant.

The pressure control apparatus according to the present invention comprises a columnar magnetostrictive element section disposed between respective one ends of a first rotating rod and a second rotating rod, wherein the first rotating rod and the second rotating rod are arranged on the same axis such that the one ends thereof are opposed to each other, the first rotating rod and the second rotating rod being connected to each other such that the opposed one ends are unrotatable relative to each other but at the same time are movable toward and away from each other along the axis, the first rotating rod and the second rotating rod being capable of rotating about the axis in unison with each other in a state where the other ends thereof are restricted in movement along a direction of the axis, urging means for always urging the first rotating rod and the second rotating rod to cause them to be closer to each other to thereby bring the respective one ends of the rotating rods into intimate contact with respective ends of the magnetostrictive element section, respectively, magnetic field-applying means for generating a magnetic field for use in adjusting a length of the magnetostrictive element section along the direction of the axis, to apply the magnetic field to the magnetostrictive element section, pressure-detecting means for detecting pressure generated in the first rotating rod and the second rotating rod in the direction of the axis, and a control section for controlling the pressure detected by the pressure-detecting means such that the pressure is constant, by controlling a strength of the magnetic field applied by the magnetic field-applying means to adjust the length of the magnetostrictive element section.

Further, the rotation drive mechanism according to the present invention comprises a drive source, a rotating rod for transmitting torque from the drive source to a work, and the above-described pressure control apparatus, wherein the rotating rod comprises the first rotating rod and the second rotating rod, and wherein the magnetostrictive element section is disposed between the respective one ends of the first and second rotating rods.

According to these pressure control apparatus and rotation drive mechanism, a magnetostrictive element section is disposed between respective one ends of a first rotating rod and a second rotating rod, and a control section controls the strength of a magnetic field applied by magnetic field-applying means to adjust the length of the magnetostrictive element section, to thereby control pressure detected by pressure-detecting means such that the pressure is constant, whereby it is possible to control pressure axially generated in the first rotating rod and the second rotating rod due to a change in temperature, such that the pressure is constant, while reliably transmitting torque to a work via the first rotating rod and the second rotating rod each of which is used in a state where movements of opposite ends thereof are restricted. This makes it possible to positively avoid occurrence of inconveniences that the drive source and the work are adversely affected by the expansion and contraction of the first rotating rod and the second rotating rod, caused by changes in temperature, and that the first rotating rod and the second rotating rod are rotated in a bent state to be broken. Further, since the magnetostrictive element section is not involved in transmission of the torque from the drive source to the work, it is possible to avoid the magnetostrictive element section being broken by addition of a twisting force to the magnetostrictive element section itself. As a result, it is possible to properly maintain the torque-transmitting function of the rotating rods for a long time period.

In this case, it is preferable that the magnetic field-applying means is formed by an excitation coil, and the magnetic field-applying means has a predetermined direct current supplied thereto in a state where the pressure detected by the pressure-detecting means is equal to a predetermined value, to thereby apply a predetermined magnetic field, and has an amount of the direct current supplied thereto controlled by the control section, to thereby have a strength of the magnetic field controlled. This configuration makes it possible to efficiently adjust the length of the magnetostrictive element section Further, it is preferable that the magnetostrictive element section comprises a magnetostrictive element the length of which is adjusted according to the strength of the magnetic field applied by the magnetic field-applying means, and a permanent magnet disposed between at least one of the first rotating rod and the second rotating rod and the magnetostrictive element to apply a bias magnetic field along the direction of the axis to the magnetostrictive element. By virtue of this configuration, there is no need to cause bias current for generating a bias magnetic field to be included in drive current, so that it is possible to largely reduce power loss occurring in a drive section and the magnetic field-applying means, thereby making it possible to largely decrease power consumption of the whole pressure control apparatus.

It should be noted that the present disclosure relates to the subject matter included in Japanese Patent Application No. 2003-140696 filed May 19, 2003, and it is apparent that all the disclosures therein are incorporated herein by reference.

BRIEF DESCRIPTION OF DRAWINGS

FIG. 6 is a front view showing the construction of a magnetostrictive element section 22.

BEST MODE FOR CARRYING OUT THE INVENTION

Hereinafter, a preferred embodiment of a pressure control apparatus and a rotation drive mechanism according to the present invention will be described with reference to the accompanying drawings.

First, the basic arrangement of the pressure control apparatus and the rotation drive mechanism according to the present invention will be described with reference to the accompanying drawings.

Figure 1:
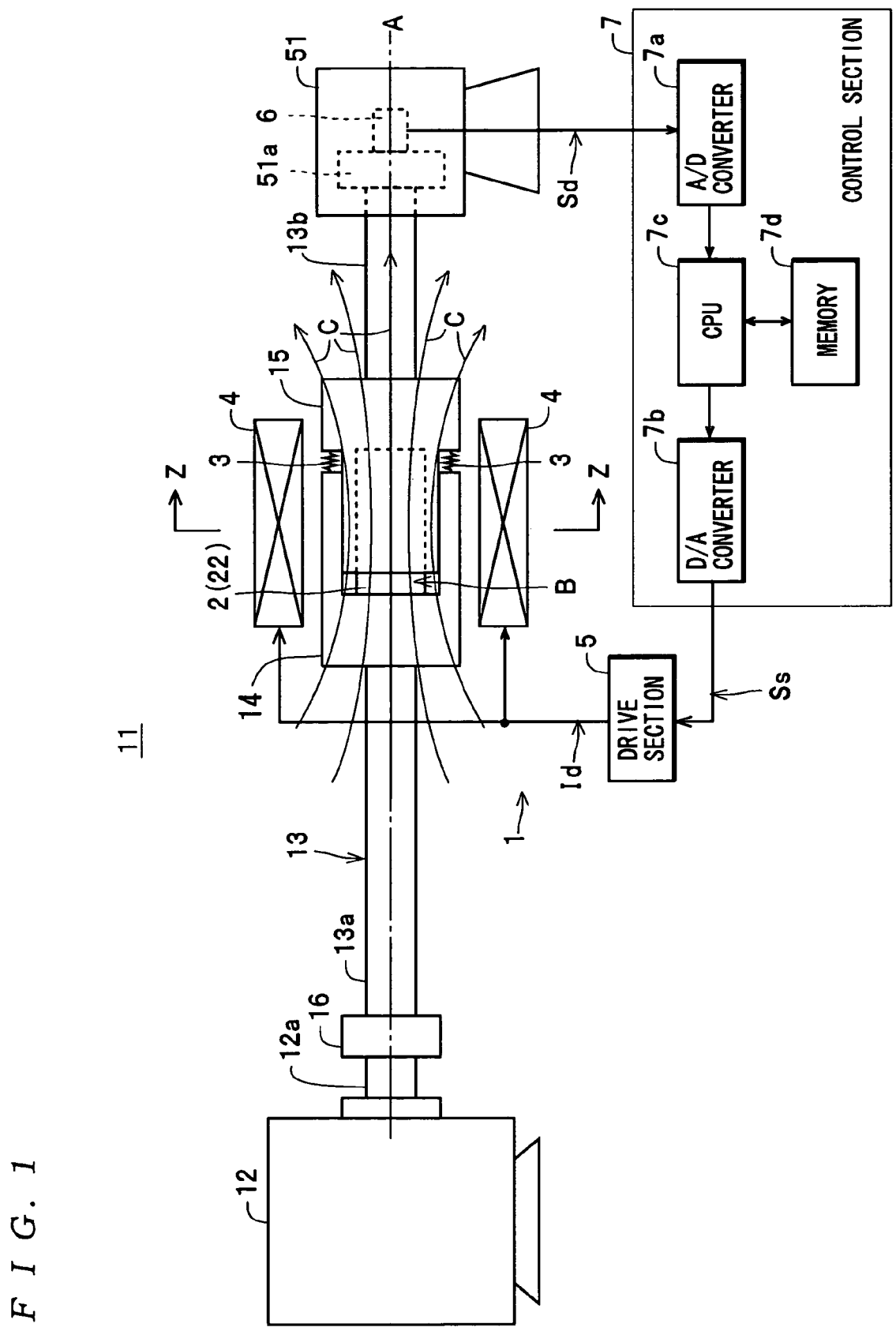
FIG. 1 is a block diagram schematically showing the arrangement of a pressure control apparatus 1 according to an embodiment of the present invention, and a rotation drive mechanism 11 in which the pressure control apparatus 1 is applied to a rotating rod.

As shown in FIG. 1, the pressure control apparatus 1 is comprised of a magnetostrictive element section 2, urging means 3 and 3, a magnetic field-applying means 4, a drive section 5, a pressure-detecting means 6, and a control section 7, and has a function of controlling pressure along the direction of an axis A in a rotating rod of the rotation drive mechanism, described hereinafter, which is generated by expansion of the rotating rod due to a change in temperature, to a predetermined (fixed) value. On the other hand, the rotation drive mechanism 11 is comprised of a drive source 12, the rotating rod 13 rotatable about the axis A, and a pressure control apparatus 1, and transmits torque from the drive source 12 to a work (to-be-driven object) 51 via the rotating rod 13 in a state where the pressure generated in the rotating rod 13 along the direction of the axis A is controlled to be constant by the pressure control apparatus 1.

Next, the component elements of the pressure control apparatus 1 and the rotation drive mechanism 11 will be described with reference to the drawings.

First, a description will be given of the component elements of the rotation drive mechanism 11. The drive source 12 is formed e.g., by an electric motor or a prime mover. In this case, an output shaft 12a of the drive source 12 is rotatably supported by a ball bearing (not shown).

Figure 2:
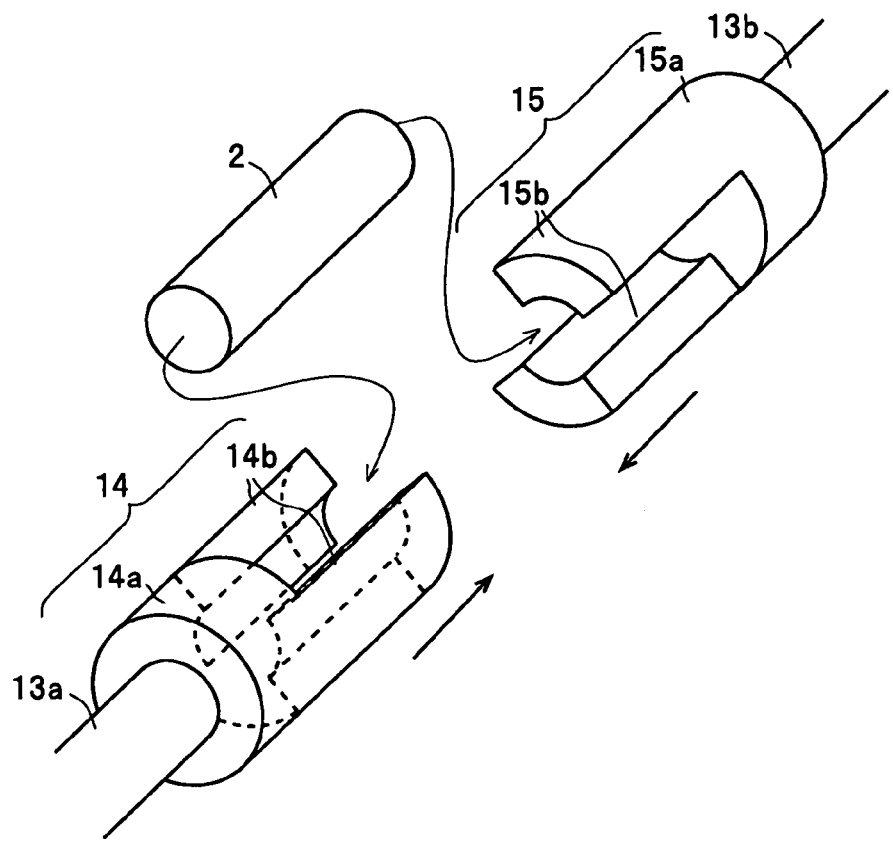
FIG. 2 is an exploded perspective view of a magnetostrictive element section 2 and connecting bodies 14 and 15.

Referring to FIG. 1, the rotating rod 13 is comprised of two rotating rods, i.e., a first rotating rod 13a and a second rotating rod 13b, arranged on the axis A such that one ends thereof are opposed to each other. Further, as shown in FIGS. 1 and 2, the opposed one ends of the rotating rods 13a and 13b are formed as connecting bodies 14 and 15, respectively. In this case, the connecting bodies 14 and 15 are connected to each other (e.g., by recess/projection fitting) such that one ends thereof opposed to each other are unrotatable relative to each other, but at the same time movable along the axis A toward and away from each other. Therefore, the rotating rods 13a and 13b as well are connected to each other such that one ends thereof opposed to each other are unrotatable relative to each other, but at the same time are movable along the axis A toward and away from each other, whereby they are configured such that they are rotatable about the axis A in unison with each other.

Figure 3:
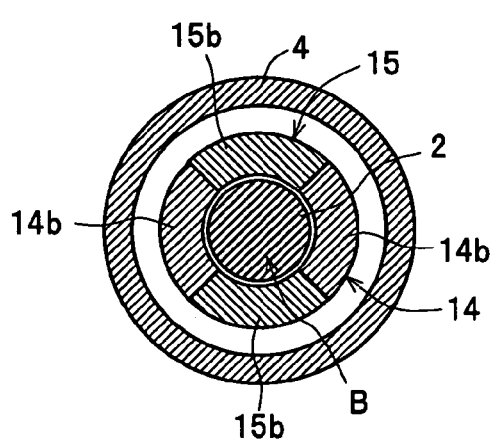
FIG. 3 is a cross-sectional view taken on line Z-Z of FIG. 1.

Further, as shown in FIG. 2, the connecting body 14 is formed e.g., by integrally forming a disk body 14a, and a plurality of (e.g., two) arcuate walls 14b and 14b, with each other, the arcuate walls 14b and 14b being erected apart from each other on an end face of the disk body 14a toward the second rotating rod 13b on the circumference of the same circle about the axis A. Similarly, the connecting body 15 is formed e.g., by integrally forming a disk body 15a, and a plurality of (e.g., two) arcuate walls 15b and 15b, with each other, the arcuate walls 15b and 15b being erected apart from each other on an end face of the disk body 15a toward the first rotating rod 13a on the circumference of the same circle about the axis A. In this case, the arcuate walls 14b and 14b and the arcuate walls 15b and 15b are erected on the circumferences of the circles with the same radius about the axis A, respectively, and formed to have the same shape, whereby they are configured such that they can be fitted to each other by insertion of the arcuate walls 15b and 15b between the arcuate walls 14b and 14b to thereby bring side surfaces thereof into intimate contact with each other. With this configuration, the connecting bodies 14 and 15 each serve such that one provides a slide guide for the other, and they are fitted to each other by recess-projection fitting such that they are unrotatable relative to each other, but at the same time are movable along the axis A. Further, as shown in FIGS. 1 and 3, in the state where the connecting bodies 14 and 15 are fitted to each other by recess-projection fitting, a hollow cylindrical body is formed by the arcuate walls 14b and 14b and the arcuate walls 15b and 15b, and a hollow cylindrical space B defined between the inner surfaces of the arcuate walls 14b and 14b and the arcuate walls 15b and 15b and the end faces (opposed surfaces) of the disk bodies 14a and 15a is formed between the connecting bodies 14 and 15. The magnetostrictive element section 2 is disposed within the space B. Further, at least the connecting bodies 14 and 15 of the rotating rods 13a and 13b are made of a nonmagnetic material, whereby they are configured such that a magnetic field C applied by the magnetic field-applying means 4 is properly transmitted to the magnetostrictive element section 2.

Further, the other end of the first rotating rod 13a (left end thereof as viewed in FIG. 1) is connected to the output shaft 12a of the drive source 12 by a coupling 16. On the other hand, the other end of the second rotating rod 13b is connected to a rotating drive body 51a in the work 51. In this case, similarly to the output shaft 12a of the drive source 12, the rotating drive body 51a in the work 51 is rotatably supported by a ball bearing (not shown). Generally, the ball bearing is comprised of an outer wheel, an inner wheel disposed inside the outer wheel, and a plurality of balls arranged between the outer wheel and the inner wheel for rotatably supporting the inner wheel. In this case, the balls are accommodated in a recessed groove circumferentially formed in an inner surface of the outer wheel and an outer surface of the inner wheel, and rotatably support the inner wheel with respect to the outer wheel by rolling in the above state. As a result, with this configuration, the ball bearing rotatably supports a to-be-supported object in a state restricting movement of the to-be-supported object along the direction of the axis (direction of thrust) within a range of play of the balls in the recessed groove. Therefore, since the output shaft 12a of the drive source 12 and the rotating drive body 51a in the work 51 have the axial movements thereof restricted within the above-described range of play by the ball bearing, the other end of the first rotating rod 13a and the other end of the second rotating rod 13b, connected to the above members, are also held in a state where movements thereof along the direction of the axis A (direction of thrust) are restricted within the range of play.

Next, a description will be given of the component elements of the pressure control apparatus 1.

Referring to FIG. 2, the magnetostrictive element section 2 is formed to have a cylindrical shape (e.g., a columnar shape), and constituted by a magnetostrictive element of which the crystal is oriented along the direction of the axis. Further, the magnetostrictive element section 2 is formed to have a length longer than that of the arcuate walls 14b and 14b and the arcuate walls 15b and 15b, and an outer diameter slightly shorter than the inner diameter of the arcuate walls 14b and 14b and the arcuate walls 15b and 15b such that the magnetostrictive element section 2 is accommodated in the space B substantially coaxially with the axis A with a small gap formed between the magnetostrictive element section 2 and the inner walls of the arcuate walls 15b and 15b. With this configuration, the magnetostrictive element section 2 can be expanded and contracted inside the connecting bodies 14 and 15, and also when the magnetostrictive element section 2 is expanded or contracted, the opposite ends of the magnetostrictive element section 2 are always held in contact with the respective end faces of the disk bodies 14a and 15a of the connecting bodies 14 and 15 (one ends of the first rotating rod 13a and the second rotating rod 13b).

Figure 4:
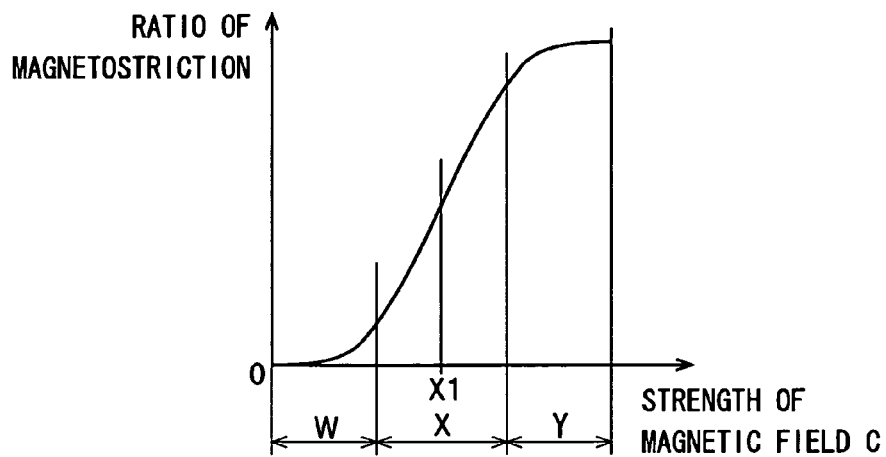
FIG. 4 is a characteristic diagram showing the relationship between the strength of a magnetic field C in the magnetostrictive element section 2 and the ratio of magnetostriction.

Generally, as shown in FIG. 4, in a region W where the magnetic field C is weak, the ratio of magnetostriction (amount of expansion) of the magnetostrictive element to the strength of the applied magnetic field C does not linearly (largely) change, with respect to a change in the strength of the magnetic field C. Further, the magnetostrictive element has characteristics that in a region X where the magnetic field C is large to some extent, the ratio of magnetostriction (amount of expansion) of the magnetostrictive element with respect to the change in the strength of the applied magnetic field C approximately linearly and largely changes, whereas in a region Y where the magnetic field C is stronger, the degree of the change in the ratio of magnetostriction of the magnetostrictive element becomes small again. Therefore, the rotation drive mechanism 11 is configured such that the strength of the magnetic field C applied to the magnetostrictive element section 2 is changed, with a strength X1 in the center of the region X, as the center, thereby making it possible to efficiently adjust the length of the magnetostrictive element section 2. More specifically, in the rotation drive mechanism 11, the magnetic field-applying means 4 is formed by an excitation coil, and has a predetermined drive current (direct current) Id supplied thereto in a state where pressure detected by the pressure-detecting means 6 is equal to a predetermined value (zero, for example), to generate the magnetic field C (predetermined magnetic field) having the strength X1 and to apply the magnetic field C to the magnetostrictive element section 2, while at the same time having the amount of the drive current Id supplied thereto controlled by the control section 7 for control of the strength of the magnetic field C. That is, the length (initial length) of the magnetostrictive element section 2 is set such that the pressure detected by the pressure-detecting means 6 is equal to a predetermined value (zero, in the illustrated example) when the temperatures of the first rotating rod 13a and the second rotating rod 13b are equal to a reference temperature (ordinary temperature, for example), in a state where magnetic field C (bias magnetic field) having the strength X1 is applied to the magnetostrictive element section 2. Further, as a magnetostrictive material, materials having a positive or negative magnetostriction characteristic, more specifically, Ni—Fe based magnetostrictive materials, RFe-based magnetostrictive materials, and so forth can be employed. Furthermore, it is also possible to employ Td-based magnetostrictive materials, which are called ultra-magnetostrictive elements, having a larger ratio of magnetostriction.

The urging means 3 always urges the first rotating rod 13a and the second rotating rod 13b to make them closer to each other, and brings the respective one ends of the first and second rotating rods 13a and 13b into intimate contact with the ends of the magnetostrictive element section 2 to thereby impart preload to the magnetostrictive element section 2. More specifically, the urging means 3 is formed e.g., by a spring (a coil spring or a leaf spring; the coil spring in the present embodiment), and has one end thereof connected to the connecting body 14 and the other end thereof fixed to the connecting body 15, as shown in FIG. 1, whereby the urging means 3 always urges the rotating rods 13a and 13b to become closer to each other by its contracting force (shrinking force).

The magnetic field-applying means 4 is formed as an excitation coil by an air-core coil formed by winding a wire material (e.g., coated copper wire) along an outer periphery of a hollow cylindrical bobbin, not shown. Further, as shown in FIG. 3, the magnetic field-applying means 4 is fitted around the connecting bodies 14 and 15 in a state where the magnetic field-applying means 4 is kept from contact with the connecting bodies 14 and 15, in a manner such that the connecting bodies 14 and 15 are located therein (such that the magnetic field-applying means 4 encloses the connecting bodies 14 and 15). Further, the magnetic field-applying means 4 is driven by the drive current (e.g., direct current) Id supplied from the drive section 5, and as shown in FIG. 1, generates the magnetic field C (direct magnetic field) for adjusting the length of the magnetostrictive element section 2 along the axis A to apply the magnetic field C to the magnetostrictive element section 2.

The drive section 5 includes an amplifier and a voltage/current converter, by way of example, and as shown in FIG. 1, generates the drive current (direct current) Id such that the drive current Id becomes equal to a current value dependent on a voltage value of an input control signal Ss, to supply the drive current to the magnetic field-applying means 4.

The pressure-detecting means 6 detects pressure in the direction of the axis A, which is applied from the other end of the other rod (second rotating rod 13b in the present embodiment) with the other end of one rotating rod (first rotating rod 13a in the present embodiment) of the first rotating rod 13a and the second rotating rod 13b as a base point, and generates and outputs a detection signal Sd whose voltage value changes according to the magnitude of the detected pressure and whose polarity changes depending on the direction of the pressure. For example, the pressure-detecting means 6 is connected to the other end of the second rotating rod 13b (or the rotating drive body 51a), and detects pressure applied from the other end of the second rotating rod 13b which is expanded and contracted within the above-described range of play of the ball bearing, with the other end of the first rotating rod 13a as a base point. In this case, it is preferable that a non-contact pressure sensor is used as the pressure-detecting means 6, since component elements of the pressure-detecting means 6 which are connected to the second rotating rod 13b rotate together with the second rotating rod 13b. As such a pressure sensor, one using a magnetostrictive element can be employed. The pressure sensor using a magnetostrictive element detects a change, which is caused by pressure, in a magnetic flux around the magnetostrictive element with a detection coil in a non-contacting manner, while applying the magnetic field C from the excitation coil to the magnetostrictive element in a non-contacting manner. Further, it is possible to employ not only the pressure sensor using a magnetostrictive element but also a non-contact pressure sensor making use of a mechanical pressure sensor using a bellows, a diaphragm, or the like. It is also possible to employ a non-contact pressure sensor formed by an electronic pressure sensor, such as a pressure sensor using a piezoelectric element or a semiconductor piezoelectric resistance, a semiconductor capacitance sensor, or a thin film pressure sensor.

The control section 7 is comprised of an A/D converter 7a, a D/A converter 7b, a CPU 7c, and a memory 7d. In this case, the CPU 7c receives a detection signal Sd generated by the pressure-detecting means 6 via the A/D converter 7a, and detects pressure generated in the rotating rod 13 based on the voltage value of the detection signal Sd. Further, the CPU 7c causes the D/A converter 7b to generate a control signal Ss having a voltage value dependent on the pressure generated in the rotating rod 13, to deliver the control signal Ss to the drive section 5, and controls the strength of the magnetic field C applied by the magnetic field-applying means 4 by changing the voltage value of the control signal Ss, for adjustment of the length of the magnetostrictive element section 2, whereby the CPU 7c controls the pressure detected by the pressure-detecting means 6 (pressure generated in the rotating rod 13; more specifically, pressure applied from the other end of the second rotating rod 13b) to a fixed value. It should be noted that the memory 7d stores a program for defining operations of the CPU 7c, and a target pressure value to be compared with the detected pressure. In the present embodiment, the target pressure value is set to a predetermined value (zero, in the illustrated example). Accordingly, the CPU 7c controls the voltage value of the control signal Ss such that the pressure detected by the pressure-detecting means 6 becomes equal to the predetermined value (zero, in the illustrated example).

Figure 5:
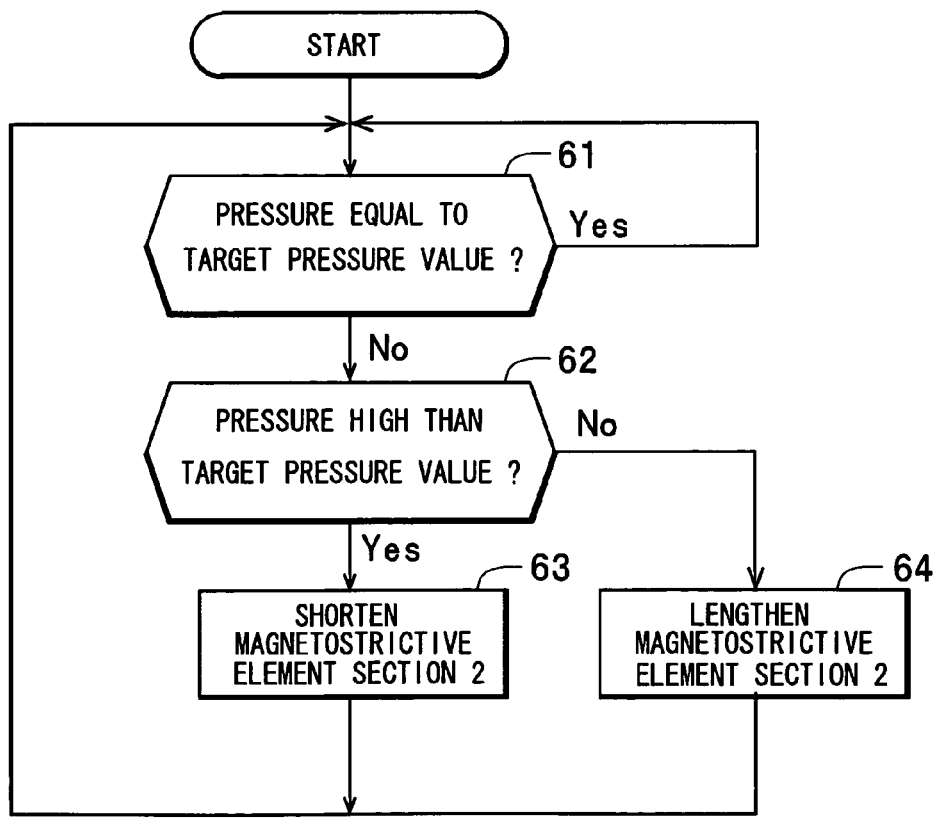
FIG. 5 is a flowchart which is useful in explaining control operation carried out by the pressure control apparatus 1, for controlling pressure generated in the direction of an axis A in a first rotating rod 13a and a second rotating rod 13b.

Next, a pressure control operation by the pressure control apparatus 1 will be described with reference to FIG. 5.

The CPU 7c in the control section 7 repeatedly determines whether or not pressure generated in the rotating rod 13 and detected based on the voltage value of the detection signal Sd generated by the pressure-detecting means 6 is equal to a target pressure value (zero, in the illustrated example), in a state where the drive source 12 is driving the rotating drive body 51a in the work 51 for rotation, via the rotating rod 13 (the first rotating rod 13a and the second rotating rod 13b) (step 61).

When the CPU 7c determines in the step 61 that the pressure is equal to the target pressure value (zero, in the illustrated example), the CPU 7c repeats the operation in the step 61. On the other hand, when determining that the pressure is not equal to the target pressure value, the CPU 7c determines whether the pressure is higher or lower than the target pressure value (whether the polarity of the pressure is positive or negative, in the illustrated example) (step 62). Now, the state where "the pressure is higher than the target pressure value" (state where the polarity of the pressure is positive, in the illustrated example) is intended to mean a state where rightward pressure as viewed in FIG. 1 is added to the pressure-detecting means 6 from the rotating rod 13. When the ambient temperature becomes higher than the ordinary temperature, the first rotating rod 13a and the second rotating rod 13b are expanded according to the amount of rise in the temperature, thereby the state where "the pressure is higher than the target pressure value" occurs. On the other hand, the state where "the pressure is lower than the target pressure value" (state where the polarity of the pressure is negative, in the illustrated example) is intended to mean a state where leftward pressure as viewed in FIG. 1 is added to the pressure-detecting means 6 from the rotating rod 13. When the ambient temperature becomes lower than the ordinary temperature, the first rotating rod 13a and the second rotating rod 13b are contracted according to the amount of lowering of the temperature, thereby the state where "the pressure is lower than the target pressure value" occurs.

When the CPU 7c determines in the step 62 that the pressure is higher than the target pressure value, the CPU 7c changes the voltage value of the control signal Ss to be delivered to the drive section 5 according to the detected pressure (e.g., when the magnetostrictive element has a positive magnetostriction characteristic, the voltage value is lowered), whereby the strength of the magnetic field C applied by the magnetic field-applying means 4 is made weaker than the present strength to thereby shorten the length of the magnetostrictive element section 2 (step 63). This enables the whole length of the first rotating rod 13a, the magnetostrictive element section 2, and the second rotating rod 13b to be made shorter than before the pressure control is carried out, so that it is possible to lower the voltage value of positive polarity voltage of the detection signal Sd detected by the pressure-detecting means 6. In other words, it is possible to decrease pressure that is generated in the rotating rod 13 (the first rotating rod 13a and the second rotating rod 13b), in a manner directed rightward, as viewed in FIG. 1, along the direction of the axis A.

On the other hand, when the CPU 7c determines in the step 62 that the pressure is lower than the target pressure value, the CPU 7c changes the voltage value of the control signal Ss to be delivered to the drive section 5 according to the detected pressure (e.g., when the magnetostrictive element has a positive magnetostriction characteristic, the voltage value is increased), whereby the strength of the magnetic field C applied by the magnetic field-applying means 4 is made stronger than the present strength to thereby increase the length of the magnetostrictive element section 2 (step 64). This enables the whole length of the first rotating rod 13a, the magnetostrictive element section 2, and the second rotating rod 13b to be made longer than before the pressure control is carried out, so that it is possible to lower the voltage value of negative polarity voltage of the detection signal Sd detected by the pressure-detecting means 6. In other words, it is possible to decrease the pressure that is generated in the rotating rod 13 (the first rotating rod 13a and the second rotating rod 13b), in a manner directed leftward, as viewed in FIG. 1, along the direction of the axis A.

The CPU 7c repeatedly carries out the steps 61 to 64 (feedback control of the length of the magnetostrictive element section 2), to thereby adjust the length of the magnetostrictive element section 2 to control the whole length of the first rotating rod 13a, the magnetostrictive element section 2, and the second rotating rod 13b, such that the voltage value of the detection signal Sd generated by the pressure-detecting means 6 becomes equal to the predetermined value (zero, for example), that is, the pressure generated in the rotating rod 13 along the direction of the axis A becomes equal to the target pressure value (zero, in the illustrated example).

As described above, according to the pressure control apparatus 1 and the rotation drive mechanism 11, the magnetostrictive element section 2 is disposed between the opposed one ends of the first rotating rod 13a and the second rotating rod 13b that are rotatable about the axis A in unison with each other, in a state where the ends of the magnetostrictive element section 2 are brought into intimate contact with the opposed one ends of the first and second rotating rods 13a and 13b, respectively; the control section 7 controls the strength of the magnetic field C applied by the magnetic field-applying means 4 to adjust the length of the magnetostrictive element section 2 such that pressure detected by the pressure-detecting means 6 becomes equal to the target pressure value (Zero, in the illustrated example), whereby it is possible to control pressure generated in the first rotating rod 13a and the second rotating rod 13b along the direction of the axis A due to a change in temperature, while reliably transmitting torque from the drive source 12 to the work 51 via the first rotating rod 13a and the second rotating rod 13b. This makes it possible to positively avoid occurrence of inconveniences that the drive source 12 and the work 51 are adversely affected by the expansion and contraction of the first rotating rod 13a and the second rotating rod 13b, caused by changes in temperature, and that the first rotating rod 13a and the second rotating rod 13b are rotated in a bent state to be broken. Further, since the first rotating rod 13a and the second rotating rod 13b are connected to each other in a manner unrotatable relative to each other and rotate in unison with each other, torque from the first rotating rod 13a is directly transmitted to the second rotating rod 13b. That is, the magnetostrictive element section 2 is not involved in transmission of the torque from the drive source 12 to the work 51. This makes it possible to avoid the magnetostrictive element section 2 being broken by addition of a twisting force to the magnetostrictive element section 2 itself. Therefore, it is possible to properly maintain a torque-transmitting function of the rotating rod 13 for a long time period.

Further, the magnetic field-applying means 4 is formed by the excitation coil, and configured to apply the magnetic field C (bias magnetic field) having the strength X1 in the state where the pressure detected by the pressure-detecting means 6 is equal to the target pressure value (zero, in the illustrated example), and at the same time have the amount of the drive current Id supplied thereto controlled by the control section 7 to thereby have the strength of the magnetic field C controlled. This makes it possible to efficiently adjust the length of the magnetostrictive element section 2.

It should be noted that the present invention is by no means limited to the above-described embodiment. For example, although in the embodiment of the present invention, the description has been given of the example in which the magnetostrictive element section 2 is formed by a magnetostrictive element alone, and the strength of the bias magnetic field is controlled to efficiently adjust the length of the magnetostrictive element section 2, this is not limitative, but in place of the above configuration, as shown in FIG. 6, the magnetostrictive element section 2 can be constructed by a magnetostrictive element section 22 comprising a magnetostrictive element 22a and a permanent magnet 22b such that a bias magnetic field is generated by the permanent magnet 22b. In this case, the magnetic field C applied by the magnetic field-applying means 4 is applied to the magnetostrictive element 22a, with the bias magnetic field generated by the permanent magnet 22b being superimposed thereon. Although in FIG. 6, the permanent magnet 22b is disposed on one end of the magnetostrictive element 22a to thereby dispose the permanent magnet 22b between one end of one of the first rotating rod 13a and the second rotating rod 13b and the magnetostrictive element 22a, by way of example, the magnetostrictive element section 2 can also be configured such that permanent magnets 22b are arranged on opposite ends of the magnetostrictive element 22a, to thereby arrange the permanent magnets 22b between each of one ends of the first rotating rod 13a and the second rotating rod 13b and the magnetostrictive element 22a. In this configuration, the polarities of the permanent magnets 22b are aligned to make the orientations of bias magnetic fields coincident with each other, and the drive current Id which has a polarity dependent on the polarity of the control signal Ss input from the drive section 5 and at the same time has a current value dependent on the voltage value of the control signal Ss is supplied to the magnetic field-applying means 4. According to this configuration, since the magnetostrictive element section 22 including the permanent magnet 22b is used, there is no need to cause bias current for generating a bias magnetic field to be included in the drive current Id, so that it is possible to largely reduce power loss occurring in the drive section 5 and the magnetic field-applying means 4, thereby making it possible to largely decease power consumption of the whole pressure control apparatus 1.

Further, although in the above-described embodiment, the description has been given of the example in which pressure generated in the first rotating rod 13a and the second rotating rod 13b is held e.g., at 0, this is not limitative, but in the pressure control apparatus 1 and the rotation drive mechanism 11, it is possible to provide control such that the pressure value is held at a predetermined arbitrary and constant value other than 0. Further, it goes without saying that the configuration of the connecting bodies 14 and 15 is not limited to the above-described one but various configurations can be employed so long as the connecting bodies 14 and 15 are connected to each other in a manner such that they are unrotatable relative to each other, but at the same time are movable toward and away from each other along the axis A.

INDUSTRIAL APPLICABILITY

As described hereinabove, according to the pressure control apparatus, a magnetostrictive element section is disposed between respective one ends of a first rotating rod and a second rotating rod, and a control section controls the strength of a magnetic field applied by magnetic field-applying means to adjust the length of the magnetostrictive element section, to thereby control pressure detected by pressure-detecting means such that the pressure is constant, whereby it is possible to control pressure axially generated in the first rotating rod and the second rotating rod due to a change in temperature such that the pressure is constant, while reliably transmitting torque to a work via the first rotating rod and the second rotating rod each of which is used in a state where movements of opposite ends thereof are restricted. Further, since the magnetostrictive element section is not involved in transmission of the torque from a drive source to the work, it is possible to avoid the magnetostrictive element section being broken by addition of a twisting force to the magnetostrictive element section itself. This makes it possible to realize a pressure control apparatus that is capable of positively avoiding occurrence of inconveniences that the drive source and the work are adversely affected by the expansion and contraction of the first rotating rod and the second rotating rod, caused by changes in temperature, and that the first rotating rod and the second rotating rod are rotated in a bent state to be broken, and at the same time properly maintaining the torque-transmitting function of the rotating rods for a long time period.

The invention claimed is:

1. A pressure control apparatus comprising:
a columnar magnetostrictive element section disposed between respective one ends of a first rotating rod and a second rotating rod, wherein the first rotating rod and the second rotating rod are arranged on the same axis such that the one ends thereof are opposed to each other, the first rotating rod and the second rotating rod being connected to each other such that the opposed one ends are unrotatable relative to each other but at the same time are movable toward and away from each other along the axis, the first rotating rod and the second rotating rod being capable of rotating about the axis in unison with each other in a state where the other ends thereof are restricted in movement along a direction of the axis;
urging means for always urging the first rotating rod and the second rotating rod to cause them to be closer to each other to thereby bring the respective one ends of the rotating rods into intimate contact with respective ends of said magnetostrictive element section, respectively;
magnetic field-applying means for generating a magnetic field for use in adjusting a length of said magnetostrictive element section along the direction of the axis, to apply the magnetic field to said magnetostrictive element section;
pressure-detecting means for detecting pressure generated in the first rotating rod and the second rotating rod in the direction of the axis; and
a control section for controlling the pressure detected by said pressure-detecting means such that the pressure is constant, by controlling a strength of the magnetic field applied by said magnetic field-applying means to adjust the length of said magnetostrictive element section.

2. A pressure control apparatus according to claim 1, wherein said magnetic field-applying means is formed by an excitation coil, and said magnetic field-applying means has a predetermined direct current supplied thereto in a state where the pressure detected by said pressure-detecting means is equal to a predetermined value, to thereby apply a predetermined magnetic field, and has an amount of the direct current supplied thereto controlled by said control section, to thereby have a strength of the magnetic field controlled.

3. A pressure control apparatus according to claim 1, wherein said magnetostrictive element section comprises a magnetostrictive element the length of which is adjusted according to the strength of the magnetic field applied by said magnetic field-applying means, and a permanent magnet disposed between at least one of the first rotating rod and the second rotating rod and said magnetostrictive element to apply a bias magnetic field along the direction of the axis to said magnetostrictive element.

4. A rotation drive mechanism comprising a drive source, a rotating rod for transmitting torque from said drive source to a work, and a pressure control apparatus according to claim 1,
wherein said rotating rod comprises the first rotating rod and the second rotating rod, and
wherein said magnetostrictive element section is disposed between the respective one ends of the first and second rotating rods.

5. A rotation drive mechanism comprising a drive source, a rotating rod for transmitting torque from said drive source to a work, and a pressure control apparatus according to claim 2,
- wherein said rotating rod comprises the first rotating rod and the second rotating rod, and
- wherein said magnetostrictive element section is disposed between the respective one ends of the first and second rotating rods.

6. A rotation drive mechanism comprising a drive source, a rotating rod for transmitting torque from said drive source to a work, and a pressure control apparatus according to claim 3,
- wherein said rotating rod comprises the first rotating rod and the second rotating rod, and
- wherein said magnetostrictive element section is disposed between the respective one ends of the first and second rotating rods.

7. A pressure control apparatus comprising:
- a generally columnar magnetostrictor disposed between respective one ends of a first rotating rod and a second rotating rod, wherein the first rotating rod and the second rotating rod are arranged on generally a same axis such that the one ends thereof are generally opposed to each other, the first rotating rod and the second rotating rod connected to each other such that the opposed one ends are generally unrotatable relative to each other but at the same time are movable toward and away from each other along the axis, the first rotating rod and the second rotating rod being rotatable about the axis in unison with each other in a state where the other ends thereof are generally restricted in movement along a direction of the axis;
- a spring configured to urge the first rotating rod and the second rotating rod to cause them to be closer to each other to bring the respective one ends of the rotating rods into contact with respective ends of said magnetostrictor, respectively;
- a magnetic field applier configured to generate a magnetic field for use in adjusting a length of said magnetostrictor along the direction of the axis, to apply the magnetic field to said magnetostrictor;
- a pressure detector configured to detect pressure generated in the first rotating rod and the second rotating rod in the general direction of the axis; and
- a controller configured to control the pressure detected by said pressure detector such that the pressure is generally constant, by controlling a strength of the magnetic field applied by said magnetic field applier to adjust the length of said magnetostrictor.

8. The pressure control apparatus according to claim 7, wherein said magnetic field applier comprises excitation coil, and said magnetic field applier has a predetermined direct current supplied thereto in a state where the pressure detected by said pressure detector is equal to a predetermined value, to apply a predetermined magnetic field, and has an amount of the direct current supplied thereto controlled by said controller, to control a strength of the magnetic field.

9. The pressure control apparatus according to claim 7, wherein said magnetostrictor comprises:
- a magnetostrictive section, a length of which is adjustable according to strength of the magnetic field applied by said magnetic field applier; and
- a permanent magnet disposed between at least one of the first rotating rod and the second rotating rod and said magnetostrictive section to apply a bias magnetic field along the direction of the axis to said magnetostrictive section.

10. A rotation drive mechanism comprising a drive source, a rotating rod for transmitting torque from said drive source to a work, and a pressure control apparatus according to claim 7, wherein:
- said rotating rod comprises the first rotating rod and the second rotating rod; and
- said magnetostrictor is disposed between the respective one ends of the first and second rotating rods.

11. A rotation drive mechanism comprising a drive source, a rotating rod for transmitting torque from said drive source to a work, and a pressure control apparatus according to claim 8, wherein:
- said rotating rod comprises the first rotating rod and the second rotating rod; and
- said magnetostrictor is disposed between the respective one ends of the first and second rotating rods.

12. A rotation drive mechanism comprising a drive source, a rotating rod for transmitting torque from said drive source to a work, and a pressure control apparatus according to claim 9, wherein:
- said rotating rod comprises the first rotating rod and the second rotating rod; and
- said magnetostrictor is disposed between the respective one ends of the first and second rotating rods.

* * * * *